US009742149B2

(12) United States Patent
Miyata et al.

(10) Patent No.: US 9,742,149 B2
(45) Date of Patent: Aug. 22, 2017

(54) METHOD FOR CONTROLLING TUNABLE WAVELENGTH LASER

(71) Applicant: Sumitomo Electric Device Innovations, Inc., Yokohama-shi (JP)

(72) Inventors: Mitsuyoshi Miyata, Yokohama (JP); Masao Shibata, Yokohama (JP); Hirokazu Tanaka, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/473,748

(22) Filed: Aug. 29, 2014

(65) Prior Publication Data
US 2015/0063384 A1 Mar. 5, 2015

(30) Foreign Application Priority Data

Aug. 30, 2013 (JP) .................................. 2013-180167

(51) Int. Cl.
*H01S 3/10* (2006.01)
*H01S 5/0687* (2006.01)
(Continued)

(52) U.S. Cl.
CPC ........ *H01S 5/0687* (2013.01); *H01S 5/06256* (2013.01); *H01S 5/0265* (2013.01);
(Continued)

(58) Field of Classification Search
CPC ...... H01S 5/024; H01S 5/0245; H01S 5/0612; H01S 5/068; H01S 5/0687; H01S 5/141;
(Continued)

(56) References Cited

U.S. PATENT DOCUMENTS

2014/0036940 A1* 2/2014 Tanaka .................. H01S 5/0617
372/20
2015/0036705 A1* 2/2015 Tanaka ................ H01S 5/06256
372/29.011
(Continued)

FOREIGN PATENT DOCUMENTS

JP 2009-026996 A 2/2009

*Primary Examiner* — Tod T Van Roy
*Assistant Examiner* — Delmar R Forde
(74) *Attorney, Agent, or Firm* — Venable LLP; Michael A. Sartori; Laura G. Remus

(57) ABSTRACT

In the method for controlling a tunable wavelength laser, information designating an oscillation wavelength is inputted. A driving condition for causing laser oscillation at a first wavelength is acquired from a memory. A control value of wavelength characteristics of the etalon and a difference between the first wavelength and a second wavelength are referred to, and a control value of wavelength characteristics of the etalon for causing laser oscillation at the second wavelength is calculated. The control value of wavelength characteristics of the etalon are assigned to the tunable wavelength laser, and a wavelength is controlled so that a wavelength sensing result becomes a first target value. Information indicating a wavelength shift amount from the designated oscillation wavelength is inputted. The wavelength sensing result is calculated as a second target value. The wavelength is controlled so that the wavelength sensing result becomes the second target value.

4 Claims, 12 Drawing Sheets

(51) Int. Cl.
*H01S 5/0625* (2006.01)
*H01S 5/026* (2006.01)
*H01S 5/06* (2006.01)
*H01S 5/12* (2006.01)

(52) U.S. Cl.
CPC ......... *H01S 5/0617* (2013.01); *H01S 5/06258* (2013.01); *H01S 5/1209* (2013.01); *H01S 5/1212* (2013.01)

(58) Field of Classification Search
CPC .. H01S 5/0683; H01S 5/06832; H01S 5/0427; H01S 5/042
USPC .......................................... 372/20, 32, 38.01
See application file for complete search history.

(56) References Cited

U.S. PATENT DOCUMENTS

| | | | |
|---|---|---|---|
| 2015/0063384 A1* | 3/2015 | Miyata | H01S 5/06256 372/20 |
| 2015/0117479 A1* | 4/2015 | Miyata | H01S 5/0683 372/20 |
| 2015/0117482 A1* | 4/2015 | Shibata | H01S 3/04 372/34 |
| 2015/0155679 A1* | 6/2015 | Miyata | H01S 3/106 372/20 |
| 2015/0188284 A1* | 7/2015 | Miyata | H01S 5/0687 372/20 |
| 2015/0222077 A1* | 8/2015 | Miyata | H01S 5/02415 372/20 |
| 2015/0222078 A1* | 8/2015 | Miyata | H01S 5/02415 372/20 |

* cited by examiner

Fig.3

| Ch | INITIAL SETTING VALUES | | | | | | | FEEDBACK CONTROL TARGET VALUES | | | TEMPERATURE CORRECTION COEFFICIENT |
|---|---|---|---|---|---|---|---|---|---|---|---|
| | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | $I_{m1}$ [μA] | $I_{m2}/I_{m1}$ A.U. | | C1 [GHz/°C] |
| 1 | 150.00 | 67.39 | 52.508 | 50.000 | 29.42 | 57.47 | 50.69 | 315.0 | 1.175 | | 0.7 |
| 2 | 150.00 | 47.74 | 34.533 | 50.000 | 64.38 | 81.31 | 72.45 | 317.5 | 1.518 | | |
| 3 | 150.00 | 50.86 | 38.727 | 50.000 | 59.05 | 77.71 | 69.12 | 313.0 | 1.229 | | |
| ... | ... | ... | ... | ... | ... | ... | ... | ... | ... | | |
| n | 150.00 | 54.77 | 54.046 | 50.000 | 41.24 | 43.32 | 11.69 | 317.2 | 1.441 | | |

*Fig.7*

|  | COEFFICIENT | |
|---|---|---|
| Ch | a | b |
| 1 | A1 | B1 |
| 2 | A2 | B2 |
| 3 | A3 | B3 |
| ⋮ | ⋮ | ⋮ |
| n | An | Bn |

METHOD FOR CONTROLLING TUNABLE WAVELENGTH LASER

FIELD OF THE INVENTION

The present invention relates to a method for controlling a tunable wavelength laser.

BACKGROUND OF THE INVENTION

A tunable wavelength laser having a selectable output wavelength is disclosed in Laid-open Japanese Patent Publication No. 2009-026996, for example.

SUMMARY OF THE INVENTION

According to the technology of Patent Literature (Laid-open Japanese Patent Publication No. 2009-026996), control conditions for obtaining grid wavelengths determined by ITU-T (International Telecommunication Union Telecommunication Standardization Sector) (hereinafter, simply referred to as grid wavelengths) are stored in a memory. A control is conducted so that oscillation occurs at any wavelength of the grid wavelengths based on the stored control conditions. For this reason, it is impossible to perform a control so that oscillation occurs at any wavelength other than the grid wavelengths. Therefore, control for implementing any wavelength other than grid wavelengths by changing the etalon temperature, which is used for a wavelength locker, (gridless control) is being considered.

The gridless control needs a wavelength change as much as the grid interval. When light transmission characteristics of the etalon have a high degree of temperature dependency, the temperature change can be made small. Therefore, lower power consumption can be implemented. However, when an etalon having a high degree of temperature dependency is used, the amount of temperature change for the purpose of fine wavelength adjustment becomes small. Therefore, high-precision temperature control is necessary during fine wavelength adjustment.

The present invention has been made in view of the above-mentioned problems, and an aspect of the present invention is to provide a method for controlling a tunable wavelength laser capable of making it unnecessary to perform high-precision temperature control during gridless control.

A method of controlling a wavelength tunable laser system having a wavelength detector including an etalon comprising: acquiring a first control value corresponding to a first wavelength including a first target value and a first value to control the wavelength characteristics of the etalon in an information designating an oscillation wavelength; acquiring an information of a second wavelength different from the first wavelength; calculating a second value to control the wavelength characteristics of the etalon based on a difference between the first wavelength and the second wavelength; controlling the wavelength characteristics of the etalon based on the second value and the first target value; acquiring a wavelength shift value of the information designating an oscillation wavelength; calculating a second target value when the wavelength of the tunable wavelength laser has shifted as much as a proportion corresponding to the wavelength shift value; and controlling the wavelength of the laser system based on a result of detection of the wavelength detector and the second target value.

BRIEF DESCRIPTION OF THE DRAWINGS

FIG. 3 is a diagram illustrating initial setting values and feedback control target values.

FIG. 7 is a diagram illustrating a table when coefficients A and B are determined for each channel.

DETAILED DESCRIPTION OF THE INVENTION

Description of Embodiments of Invention

First, details of embodiments of the present invention will be listed and explained.

A method of controlling a wavelength tunable laser system having a wavelength detector including an etalon comprising: acquiring a first control value corresponding to a first wavelength including a first target value and a first value to control the wavelength characteristics of the etalon in an information designating an oscillation wavelength; acquiring an information of a second wavelength different from the first wavelength; calculating a second value to control the wavelength characteristics of the etalon based on a difference between the first wavelength and the second wavelength; controlling the wavelength characteristics of the etalon based on the second value and the first target value; acquiring a wavelength shift value of the information designating an oscillation wavelength; calculating a second target value when the wavelength of the tunable wavelength laser has shifted as much as a proportion corresponding to the wavelength shift value; and controlling the wavelength of the laser system based on a result of detection of the wavelength detector and the second target value.

According to a method for controlling a tunable wavelength laser according to an aspect of the present invention, it is possible to make high-precision temperature control unnecessary when conducting gridless control.

The control value of wavelength characteristics of the etalon may be temperature of the etalon. The second target value may be obtained by a wavelength difference between a wavelength outputted in the referring and the second wavelength and by a correction coefficient. The temperature of the tunable wavelength laser may be controlled by a temperature control device, and the seventh step may be performed by means of temperature control by the temperature control device.

According to a method for controlling the wavelength of a tunable wavelength laser according to an aspect of the present invention, it can be made unnecessary to perform high-precision temperature control during gridless control.

Detailed Description of Embodiments of Invention

Hereinafter, embodiments of the present invention will be described with reference to the accompanying drawings.

Figure 1:
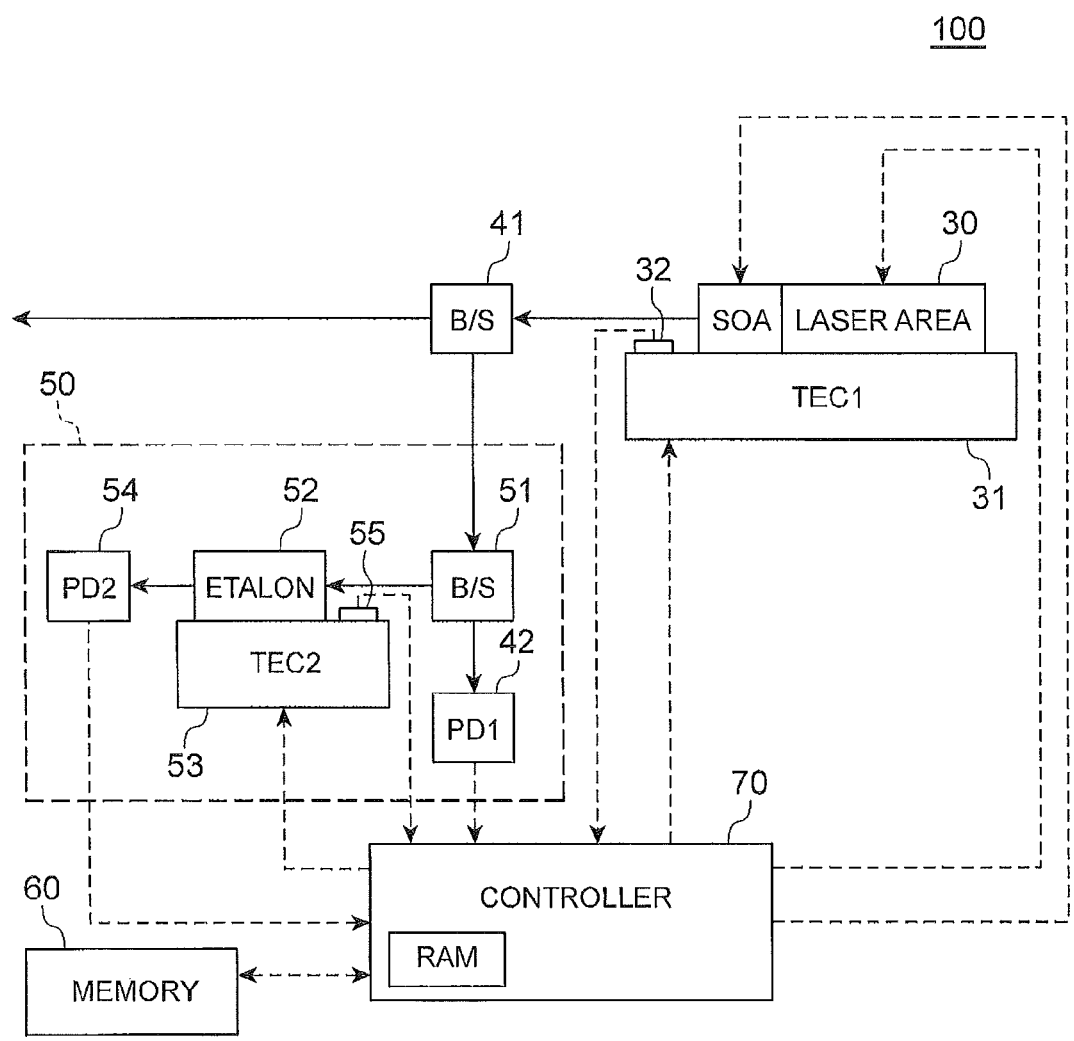
FIG. 1 is a block diagram illustrating an overall configuration of a tunable wavelength laser according to a first embodiment.

FIG. 1 is a block diagram illustrating an overall configuration of a tunable wavelength laser 100 according to a first embodiment. As illustrated in FIG. 1, the tunable wavelength laser 100 includes a semiconductor laser 30, the wavelength of which can be controlled (tunable semiconductor laser), as a laser device. The semiconductor laser 30 according to the present embodiment is provided with an area, which is connected to a laser area and becomes a SOA (Semiconductor Optical Amplifier). The SOA functions as an optical output control unit. The SOA can increase/decrease the intensity of optical output as desired. The SOA can also control the intensity of optical output to be substantially zero. The tunable wavelength laser 100 includes a sensing unit 50, a memory 60, a controller 70, and the like. The sensing unit 50 functions as an output sensing unit and a wavelength locker unit. The controller 70 is configured to control the tunable wavelength laser 100. The controller 70 has a RAM (Random Access Memory) inside it.

Figure 2:
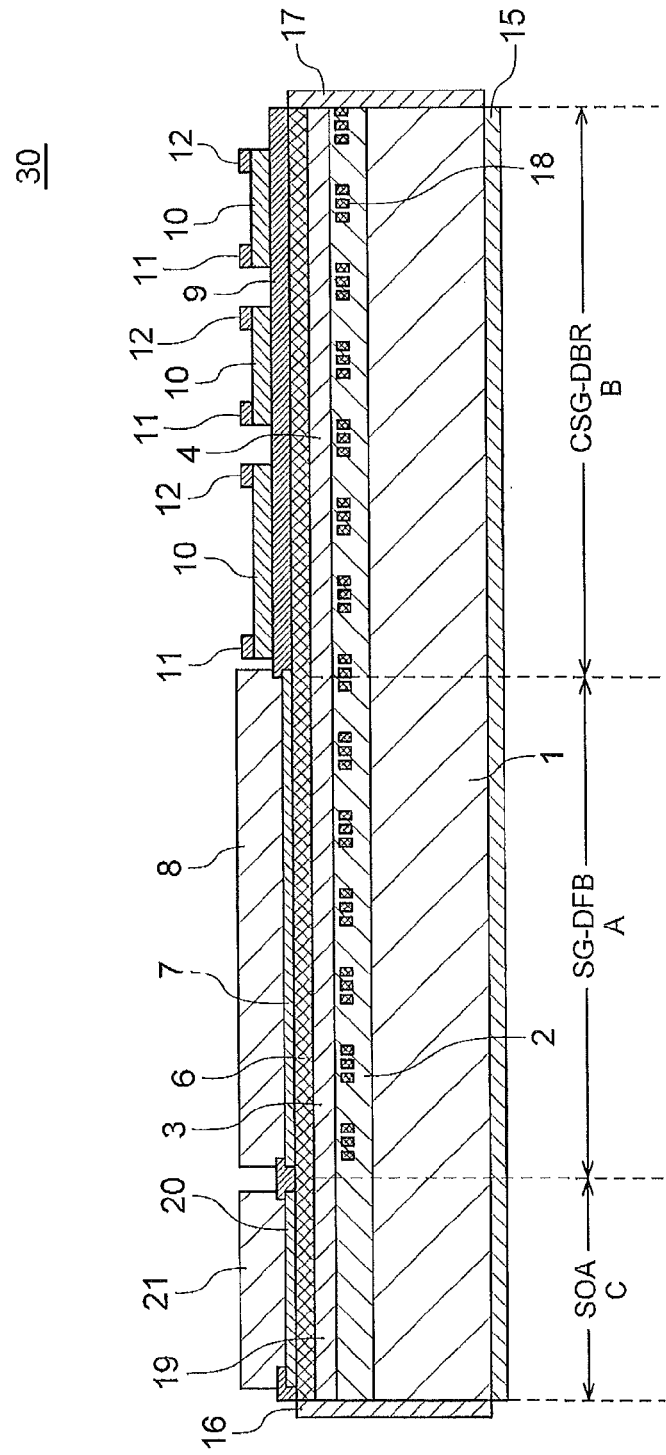
FIG. 2 is a schematic sectional view illustrating an overall configuration of a semiconductor laser.

FIG. 2 is a schematic sectional view illustrating an overall configuration of a semiconductor laser 30 according to the present embodiment. As illustrated in FIG. 2, the semiconductor laser 30 includes a SG-DFB (Sampled Grating Distributed Feedback) area A, a CSG-DBR (Chirped Sampled Grating Distributed Bragg Reflector) area B, and a SOA (Semiconductor Optical Amplifier) area C. That is, the semiconductor laser 30 is a laser having a wavelength selection mirror inside the semiconductor structure.

As an example, the semiconductor laser 30 has, spanning from its front side to the rear side, a SOA area C, a SG-DFB area A, and a CSG-DBR area B arranged in this order. The SG-DFB area A has a gain and includes a sampled grating. The CSG-DBR area B has no gain and includes a sampled grating. The SG-DFB area A and the CSG-DBR area B correspond to the laser area of FIG. 1. The SOA area C corresponds to the SOA area of FIG. 2.

The SG-DFB area A has a lower clad layer 2, an active layer 3, an upper clad layer 6, a contact layer 7, and an electrode 8. The lower clad layer 2, the active layer 3, the upper clad layer 6, the contact layer 7, and the electrode 8 are stacked on a substrate 1. The CSG-DBR area B has a lower clad layer 2, an optical waveguide layer 4, an upper clad layer 6, an insulation film 9, and a plurality of heaters 10. The lower clad layer 2, the optical waveguide layer 4, the upper clad layer 6, the insulation film 9, and the plurality of heaters 10 are stacked on the substrate 1. Each heater 10 is provided with a power source electrode 11 and a ground electrode 12. The SOA area C has a lower clad layer 2, an optical amplification layer 19, an upper clad layer 6, a contact layer 20, and an electrode 21. The lower clad layer 2, the optical amplification layer 19, the upper clad layer 6, the contact layer 20, and the electrode 21 are stacked on the substrate 1.

In connection with the SG-DFB area A, the CSG-DBR area B, and the SOA area C, the substrate 1, the lower clad layer 2, and the upper clad layer 6 are formed integrally. The active layer 3, the optical waveguide layer 4, and the optical amplification layer 19 are formed on the same surface. The boundary between the SG-DFB area A and the CSG-DBR area B corresponds to the boundary between the active layer 3 and the optical waveguide layer 4.

An end surface film 16 is formed on end surfaces of the substrate 1, the lower clad 2, the optical amplification layer 19, and the upper clad layer 6, which are adjacent to the SOA area C. The end surface film 16 is an AR (Anti-Reflection) film. The end surface film 16 is a front-side end surface of the semiconductor laser 30. An end surface film 17 is formed on end surfaces of the substrate 1, the lower clad 2, the optical amplification layer 4, and the upper clad layer 6, which are adjacent to the CSG-DBR area B. The end surface film 17 is an AR film. The end surface film 17 is a rear-side end surface of the semiconductor laser 30.

The substrate 1 is a crystal substrate made of n-type InP, for example. The lower clad layer 2 is composed of n-type InP, for example. The upper clad layer 6 is composed of p-type InP, for example. The lower clad layer 2 and the upper clad layer 6 optically confine the active layer 3, the optical waveguide layer 4, and the optical amplification layer 19 from below and above, respectively.

The active layer 3 is composed of a semiconductor having a gain. The active layer 3 has a quantum well structure, for example. The active layer 3 has well layers and barrier layers, for example. The well layers and the barrier layers are stacked alternately. The well layers are composed of $Ga_{0.32}In_{0.68}As_{0.92}P_{0.08}$ (thickness: 5 nm). The barrier layers are composed of $Ga_{0.22}In_{0.78}As_{0.47}P_{0.53}$ (thickness: 10 nm). The optical waveguide layer 4 can be composed of a bulk semiconductor layer, for example. The optical waveguide layer 4 is composed of $Ga_{0.22}In_{0.78}As_{0.47}P_{0.53}$, for example. The optical waveguide layer 4 has an energy gap larger than that of the active layer 3.

The optical amplification layer 19 is given a gain by current injection from the electrode 21. As a result, the optical amplification layer 19 conducts optical amplification. The optical amplification layer 19 has a quantum well structure, for example. The optical amplification layer 19 has well layers and barrier layers. The well layers and the barrier layers are stacked alternately. The well layers are composed of $Ga_{0.35}In_{0.65}As_{0.99}P_{0.01}$ (thickness: 5 nm), for example. The barrier layers are composed of $Ga_{0.15}In_{0.85}As_{0.32}P_{0.68}$ (thickness: 10 nm), for example. As another structure, furthermore, it is also possible to employ a bulk semiconductor made of $Ga_{0.44}In_{0.56}As_{0.95}P_{0.05}$, for example. The optical amplification layer 19 and the active layer 3 can also be composed of the same material.

The contact layers 7, 20 can be composed of p-type $Ga_{0.47}In_{0.53}As$ crystals, for example. The insulation film 9 is a protection film. The protection film is composed of silicon nitride (SiN) or silicon oxide (SiO). The heaters 10 are thin-film resistors. The thin-film resistors are composed of titanium tungsten (TiW). Each of the heaters 10 may be formed across a plurality of segments of the CSG-DBR area B.

The electrodes 8, 21, the power supply electrodes 11, and the ground electrodes 12 are composed of a conductive material, such as gold (Au). A back electrode 15 is formed beneath the substrate 1. The back electrode 15 is formed across the SG-DFB area A, the CSG-DBR area B, and the SOA area C.

The end surface film 16 and the end surface film 17 are AR films having a reflection ratio of 1.0% or less. The end surface film 16 and the end surface film 17 have characteristics making their end surfaces substantially non-reflective. The AR films are composed of dielectric films. The dielectric films are composed of $MgF_2$ and TiON, for example. In addition, both ends of the laser are AR films. However, both ends of the laser may also have end surface films 17 composed of reflective films having a meaningful reflection ratio. In the case of a structure providing a light absorption layer on a semiconductor adjoining the end surface film 17 illustrated in FIG. 2, a meaningful reflection ratio of the end surface film 17 can suppress optical output leaking from the end surface film 17 to the outside. The meaningful reflection ratio, as used herein, refers to a reflection ratio of 10% or higher, for example. In addition, the reflection ratio in this connection refers to a reflection ratio with regard to the inside of the semiconductor laser.

Diffraction gratings (corrugation) 18 are formed in a plurality of positions at a predetermined interval on the lower clad layers 2 of the SG-DFB area A and the CSG-DBR area B. A sampled grating is formed in the SG-DFB area A and the CSG-DBR area B. The SG-DFB area A and the CSG-DBR area B are provided with a plurality of segments on the lower clad layers 2. Each segment, as used herein, refers to an area having one diffraction grating portion and a space portion positioned consecutively. Each diffraction grating portion is provided with a diffraction grating 18. Each space portion is provided with no diffraction grating 18. In other words, a segment refers to an area having a space portion, both ends of which are interposed between diffraction grating portions, and a diffraction grating portion connected to each other. The diffraction gratings 18 are composed of a material having a refractive index different from that of the lower clad layers 2. When the lower clad layers 2 are made of InP, the diffraction gratings are composed of $Ga_{0.22}In_{0.78}As_{0.47}P_{0.53}$, for example.

The diffraction gratings 18 are formed by patterning using a two-beam interference exposure method. The space portions are positioned between the diffraction gratings 18. The space portions can be implemented by exposing patterns of the diffraction gratings 18 to light by means of a resist and then performing additional light exposure in positions that correspond to the space portions. The pitch of the diffraction gratings 18 in the SG-DFB area A and the pitch of the diffraction gratings 18 in the CSG-DBR area B may be identical. Furthermore, the pitch of the diffraction gratings 18 in the SG-DFB area A and the pitch of the diffraction gratings 18 in the CSG-DBR area B may be different. The tunable wavelength laser device 200 has, as an example, both pitches set to be identical. In connection with respective segments, the diffraction gratings 18 may have the same length. Furthermore, the diffraction gratings 18 may have different lengths. Respective diffraction gratings 18 of the SG-DFB area A may have the same length. Respective diffraction gratings 18 of the CSG-DBR area B may have the same length. The length of the diffraction gratings 18 of the SG-DFB area A and the length of the diffraction gratings 18 of the CSG-DBR area B may be different from each other.

In the SG-DFB area A, respective segments have substantially the same optical path length. In the CSG-DBR area B, at least two segments have different optical path lengths. The peak-related intensity of wavelength characteristics of the CSG-DBR area B has wavelength dependency. The average optical path length of segments of the SG-DFB area A and the average optical path length of segments of the CSG-DBR area B are different from each other. The segments inside the SG-DFB area A and the segments inside the CSG-DBR area B constitute a resonator in the semiconductor laser 30.

Inside each of the SG-DFB area A and the CSG-DBR area B, reflected light interferes with each other. The SG-DFB area A is provided with an active layer 3. Carrier injection into the SG-DFB area A generates a discrete gain spectrum. This spectrum has a wavelength interval having approximately uniform peak intensities. In the CSG-DBR area B, a discrete reflection spectrum is generated. This spectrum has a wavelength interval having different peak intensities. The intervals of peak wavelengths of wavelength characteristics in the SG-DFB area A and the CSG-DBR area B are different from each other. It is possible to select a wavelength, which meets the oscillation condition, by using the Vernier effect resulting from a combination of such wavelength characteristics.

As illustrated in FIG. 1, the semiconductor laser 30 is arranged on a first temperature control device 31. The first temperature control device 31 includes a Peltier element. The first temperature control device 31 functions as a TEC (Thermoelectric Cooler). The first thermistor 32 is arranged on the first temperature control device 31. The first thermistor 32 detects the temperature of the first temperature control device 31. It is possible to specify the temperature of the semiconductor laser 30 based on the detection temperature of the first thermistor 32.

The tunable wavelength laser 100 includes a sensing unit 50. The sensing unit 50 is arranged on the front side of the semiconductor laser 30. The sensing unit 50 functions as a wavelength locker unit. Therefore, the tunable wavelength laser 100 can be called a front locker type. The sensing unit 50 includes a first light-receiving element 42, a beam splitter 51, an etalon 52, a second temperature control device 53, a second light-receiving element 54, and a second thermistor 55.

The beam splitter 41 is positioned to split output light from the front side of the semiconductor laser 30. The beam splitter 51 is positioned to split light from the beam splitter 41. The first light-receiving element 42 is positioned to receive one of two portions of light split by the beam splitter 51. The etalon 52 is positioned to transmit the other of the two portions of light split by the beam splitter 51. The second light-receiving element 54 is positioned to receive transmitted light that has passed through the etalon 52.

The etalon 52 has characteristics of periodically changing its transmission ratio in response to the wavelength of incident light. In the present embodiment, a solid etalon is used as the etalon 52. The corresponding periodic wavelength characteristics of the solid etalon change in response to a temperature change. The etalon 52 is positioned to transmit the other of the two portions of light split by the beam splitter 51. The etalon 52 is arranged on the second temperature control device 53. The second temperature control device 53 includes a Peltier element. The second temperature control device 53 functions as a TEC (Thermoelectric Cooler).

The second light-receiving element 54 is positioned to receive transmitted light that has passed through the etalon 52. The second thermistor 55 specifies the temperature of the etalon 52. The second thermistor 55 is arranged on the second temperature control device 53, for example. In the present embodiment, the temperature of the etalon 52 is specified by detecting the temperature of the second temperature control device 53 by the second thermistor 55.

The memory 60 is a rewritable memory device. The rewritable memory device may typically be a flash memory. The controller 70 includes a CPU (Central Processing Unit), a RAM (Random Access Memory), a power supply, and the like. The RAM is a memory configured to temporarily memorize a program executed by the CPU, data processed by the CPU, and the like.

The memory 60 has initial setting values and feedback control target values of respective components of the tunable wavelength laser 100 memorized so as to correspond to channels. The channels, as used herein, refer to numbers corresponding to oscillation wavelengths of the semiconductor laser 30. For example, respective channels correspond to grid wavelengths of ITU-T (International Telecommunication Union Telecommunication Standardization Sector). In the present embodiment, the wavelength of each channel is defined as a fundamental wavelength.

FIG. 3 is a diagram illustrating the above-mentioned initial setting values and feedback control target values. As illustrated in FIG. 3, the above-mentioned initial setting values include initial current values $I_{LD}$, initial current values $I_{SOA}$, initial temperature values $T_{LD}$, initial temperature values $T_{Etalon}$, and initial power values $P_{Heater1}$-$P_{Heater3}$. The initial current values $I_{LD}$ are current values supplied to the electrode 8 of the SG-DFB area A. The initial current values $I_{SOA}$ are current values supplied to the electrode 21 of the SOA area C. The initial temperature values $T_{LD}$ are temperatures of the semiconductor laser 30. The initial temperature values $T_{Etalon}$ are temperatures of the etalon 52. The initial power values $P_{Heater1}$-$P_{Heater3}$ are power values supplied to respective heaters 10. These initial setting values are determined with respect to respective channels. The feedback control target values are target values when performing feedback control of the controller 70. The feedback control target values include target value $I_m$ and target value $I_{m2}/I_{m1}$. The target value $I_m$ is a target value of a photocurrent outputted by the first light-receiving element 42. The target value $I_{m2}/I_{m1}$ is a target value of a ratio of a photocurrent $I_{m2}$ outputted by the second light-receiving element 54 with regard to a photocurrent $I_{m1}$ outputted by the first light-receiving element 42. The control target values are determined with respect to respective channels. The memory 60 has a temperature correction coefficient C1 stored therein. Details of the temperature correction coefficient C1 will be described later. In the present embodiment, the temperature correction coefficient C1 is a value common to respective channels. Furthermore, each of these values is obtained for each individual object by means of tuning using a wavemeter, prior to shipping of the tunable wavelength laser 100.

Figure 4:
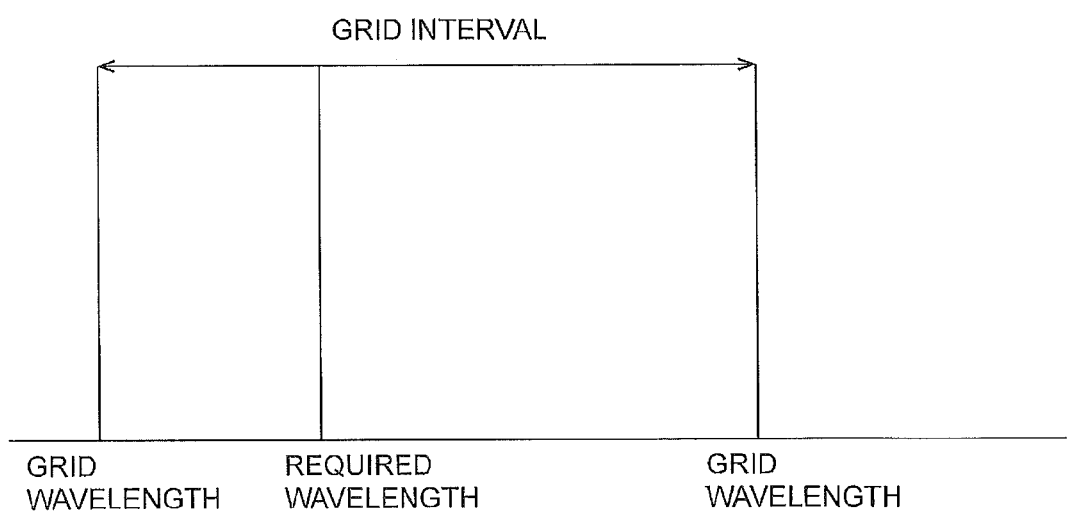
FIG. 4 is a diagram illustrating a relationship between a required wavelength and a fundamental wavelength in connection with gridless control.

The tunable wavelength laser 100 according to the present embodiment can output the required wavelength even if the required wavelength does not coincide with the fundamental wavelength. Control that enables output at a wavelength different from the fundamental wavelength will hereafter be referred to as gridless control. FIG. 4 is a diagram illustrating a relationship between a required wavelength and a fundamental wavelength in connection with the gridless control. As illustrated in FIG. 4, in the case of the gridless control, a required wavelength is a wavelength between a fundamental wavelength and another fundamental wavelength adjacent to it. In addition, the required wavelength does not need to coincide with the fundamental wavelength.

Figure 5:
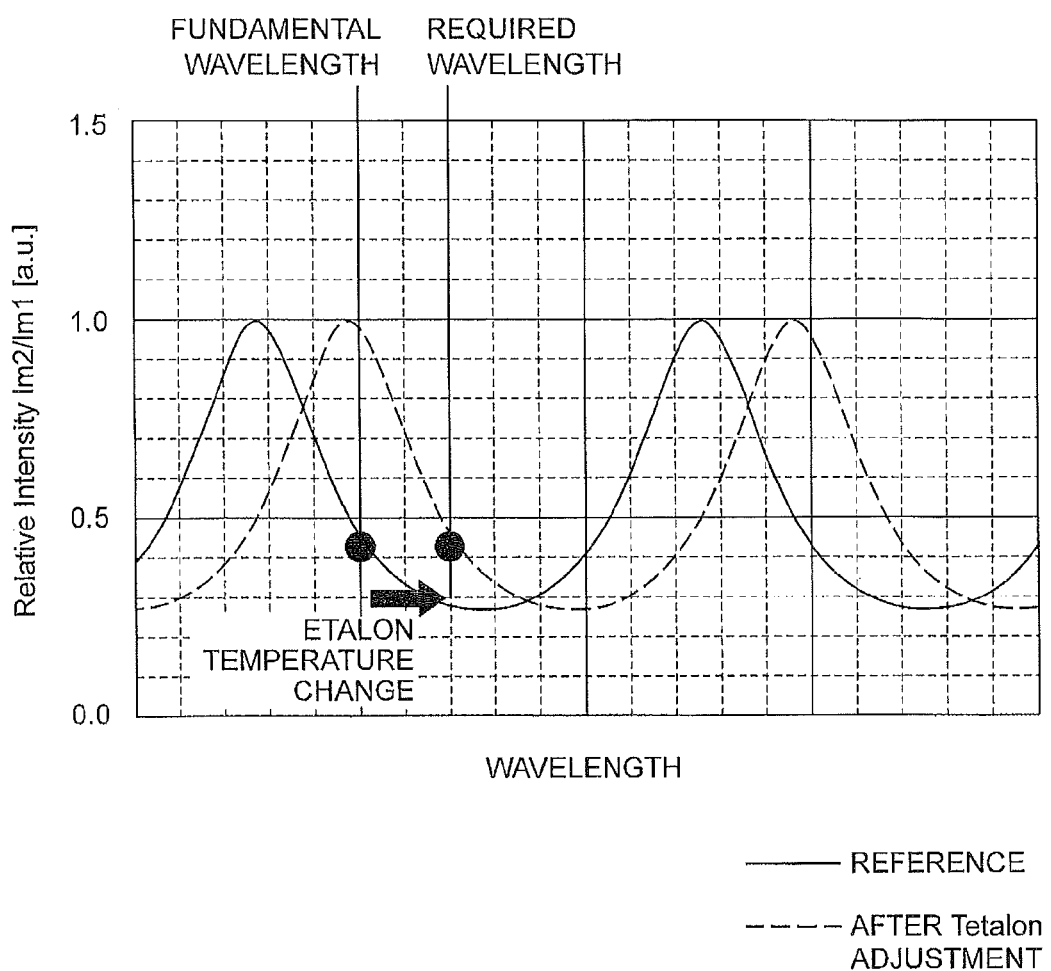
FIG. 5 is a diagram illustrating the principle of gridless control.

FIG. 5 is a diagram illustrating the principle of gridless control. In FIG. 5, the axis of abscissa indicates wavelengths. The axis of ordinate indicates normalized values of ratio $I_{m2}/I_{m1}$ (transmission ratio of the etalon 52). In FIG. 5, the solid line corresponds to wavelength characteristics corresponding to the initial temperature value $T_{Etalon}$ of the etalon 52. The dotted line corresponds to wavelength characteristics when the temperature of the etalon 52 has been raised by the second temperature control device 53. It will be assumed in this regard that the ratio $I_{m2}/I_{m1}$ associated with the black circle on the solid line is a feedback target value. In this case, when the temperature of the etalon 52 is the initial temperature value $T_{Etalon}$, oscillation occurs at the fundamental wavelength. On the other hand, it will be assumed that the temperature of the etalon 52 corresponds to wavelength characteristics indicated by the dotted line. In this case, even if the ratio $I_{m2}/I_{m1}$ is a value for obtaining a fundamental wavelength (black circle on the dotted line), the actual oscillation wavelength shifts from the fundamental wavelength as much as the amount of change of etalon characteristics. In summary, the required wavelength can be implemented by shifting the etalon characteristics as much as the wavelength difference between the required wavelength and the fundamental wavelength, without any change of the ratio $I_{m2}/I_{m1}$, which is a feedback target value. In other words, computation for changing the etalon temperature based on the wavelength difference ΔF between the required wavelength and the fundamental wavelength is conducted. By applying this as the etalon temperature, then, the required wavelength can be implemented.

As described, the wave characteristics of the etalon 52 shift according to its temperature. The frequency variation amount/temperature change amount [GHz/° C.] regarding the etalon 52 will be referred to as a temperature correction coefficient C1 of the etalon 52. In addition, wavelengths are expressed by frequencies herein. The temperature correction coefficient C1 corresponds to a rate of change with respect to a wavelength change of the driving condition of the tunable wavelength laser.

It will be assumed that a setting temperature of the etalon 52 for implementing control of the required wavelength is $T_{etln\_A}$ [° C.]. It is assumed that the initial temperature of the etalon 52, i.e. temperature of the etalon 52 corresponding to a selected fundamental wavelength is $T_{etln\_B}$ [° C.]. $T_{etln\_B}$ corresponds to $T_{Etalon}$. In addition, $T_{etln\_B}$ is acquired from the memory 60. It is assumed that the wavelength difference (absolute value) between the fundamental wavelength and the required wavelength is ΔF [GHz]. In this case, the relationship between respective parameters can be expressed as in Equation (1) below. It is possible to acquire a setting temperature $T_{etln\_A}$, which is needed to obtain the required wavelength, based on Equation (1).

$$T_{etln\_A}=T_{etln\_B}+\Delta F/C1 \quad (1)$$

It is possible to obtain the required wavelength, while using the ratio $I_{m2}/I_{m1}$ without changing it, by controlling the temperature of the second temperature control device 53 to the setting temperature $T_{ethln\_A}$.

Execution of the above-described operation enables the semiconductor laser 30 to conduct laser oscillation by means of a wavelength (required wavelength) shifted from the fundamental wavelength as much as the amount of shift of characteristics of the etalon 52, as illustrated in FIG. 5. The above-mentioned required wavelength is a wavelength other than a wavelength (fundamental wavelength) obtained by oscillation in a condition recorded in the memory. However, in order to obtain oscillation at the required wavelength, execution needs to be performed while laser oscillation is suspended, as in the case of outputting the fundamental wavelength.

On the other hand, the tunable wavelength laser 100 has a function of conducting fine adjustment (fine tuning) of an output wavelength that has already been used during oscillation, regardless of whether a fundamental wavelength or a required wavelength, as a performance of the tunable wavelength laser. For example, when this fine tuning is employed, the user can optimize the wavelength at each communication line. Therefore, this fine tuning requires operations of changing the oscillation wavelength while the tunable wavelength laser maintains the oscillation state.

In order to implement fine tuning, it is necessary to input parameters for fine tuning to the tunable wavelength laser, besides parameters indicating oscillation wavelengths. Typical input parameters of the tunable wavelength laser include, for example, a designated oscillation wavelength (fundamental wavelength or required wavelength) and a fine tuning value, as given in Table 1. The fine tuning value is a difference wavelength (ΔFine) from the designated oscillation wavelength.

TABLE 1

| Oscillation wavelength | Fine tuning value (ΔFine) |
|---|---|
| 191.3000 THz | ±1.000 GHz |

The fine tuning value can be changed while the tunable wavelength laser is oscillating. Therefore, the tunable wavelength laser needs to be able to change its oscillation wavelength.

The initial value of the fine tuning value is zero. In addition, the maximum value of the fine tuning value is limited to about +25.000 GHz. That is, the amount of controlled change from the oscillation wavelength is limited to about ±25.000 GHz. The maximum value of the fine tuning value is smaller than the wavelength interval (grid wavelength interval) of a channel recorded in the memory. Furthermore, the maximum value of the fine tuning value is smaller than the upper limit of the amount of wavelength change (fundamental wavelength–target wavelength) resulting from gridless control.

Figure 6A:
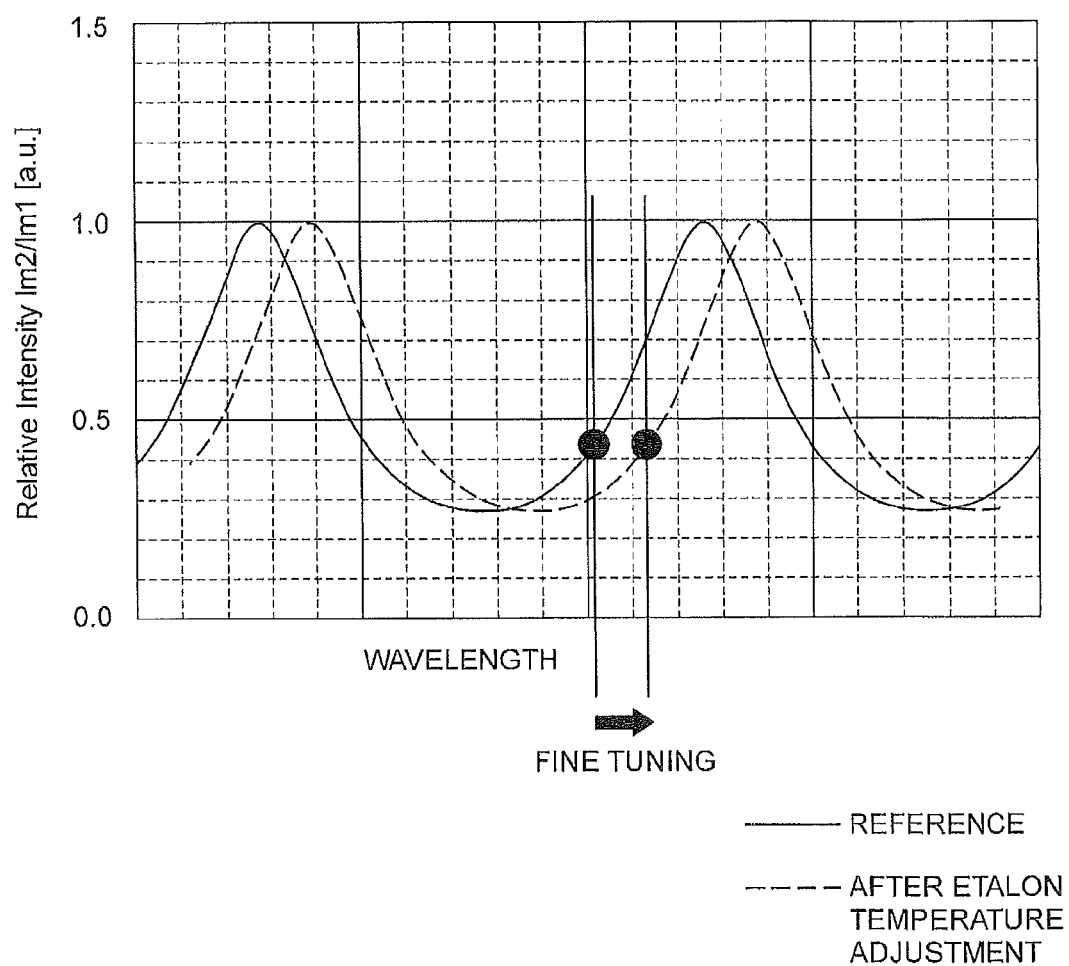
FIG. 6A is a diagram illustrating fine tuning using a temperature change of an etalon.

When the temperature of the etalon 52 is changed under gridless control, the light transmission characteristics of the etalon 52 need to be changed to a large extent. This type of etalon uses the temperature as a control value of wavelength characteristics of the etalon. This temperature control employs a TEC for etalon temperature control, which has a Peltier element. Temperature control of the TEC requires power. Therefore, in order to implement low power consumption by suppressing the amount of temperature change, it is preferred to use an etalon having a high degree of temperature dependency. Meanwhile, in the case of conducting fine adjustment of a wavelength through the fine tuning, the wavelength is adjusted by changing the etalon temperature. FIG. 6A is a diagram illustrating fine tuning in this case. However, in the case of an etalon having a high degree of temperature dependency, the amount of temperature change necessary for fine adjustment of the wavelength is minute. Therefore, high-precision temperature control is necessary. For the purpose of high-precision temperature control, a high-performance, expensive component needs to be used as a circuit component for temperature detection and temperature adjustment. In this case, the cost increases. The same problem occurs when the etalon 52 is a liquid-crystal etalon. In the case of the liquid-crystal etalon, wavelength characteristics of the etalon are not controlled not by the temperature, but by the change of refractive index of the liquid crystals. Even in the case of the liquid-crystal etalon, small wavelength characteristic control, which is suitable for fine adjustment, is difficult when a large tunable width of the wavelength characteristics is taken. Furthermore, as another method for controlling the wavelength characteristics of the etalon, there is also a method of providing a heater thermally coupled to the etalon. The same problem occurs even in this case.

Figure 6B:
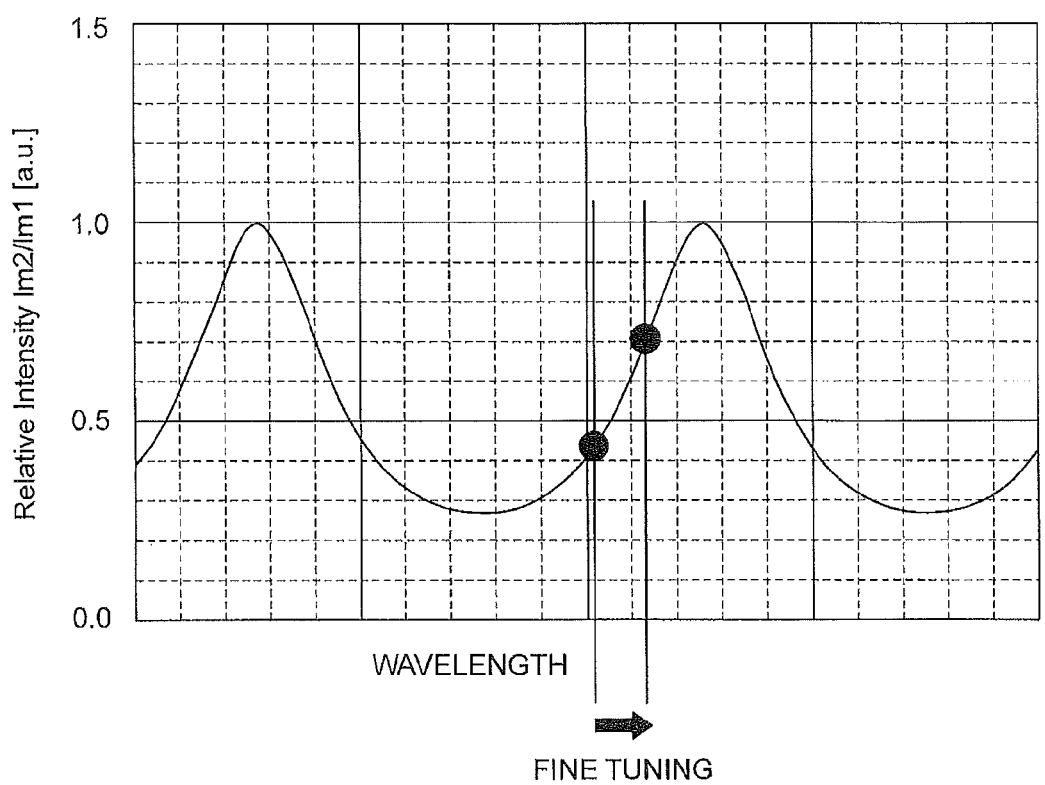
FIG. 6B is a diagram illustrating a change of a feedback control target value.

In this connection, the tunable wavelength laser 100 according to the present embodiment does not change (constantly maintains) the temperature of the etalon 52 during fine tuning, but changes the light transmission ratio target of AFC control. The tunable wavelength laser 100 changes the ratio $I_{m2}/I_{m1}$ of feedback control target values. FIG. 6B is a diagram illustrating the change of the ratio $I_{m2}/I_{m1}$ of feedback control target values. According to this technique, there is no need to change the temperature of the etalon 52 even when the light transmission ratio of the etalon 52 has a high degree of temperature dependency. Therefore, high-precision temperature control is unnecessary. In other words, it is possible to make high-precision temperature control unnecessary in connection with fine tuning when conducting gridless control. Furthermore, the amount of variation of the ratio $I_{m2}/I_{m1}$ of feedback control target values increases with respect to a minute amount of wavelength variation. Therefore, fine adjustment becomes easier compared with a case of changing the temperature of the etalon 52.

It is possible to obtain the amount of change of the ratio $I_{m2}/I_{m1}$ (Equation (2)) with respect to the amount of wavelength change in connection with fine tuning, by acquiring a relationship between the wavelength and transmission ratio of the etalon 52. For example, the relationship between the wavelength and transmission ratio of the etalon 52 can be approximated by a quadratic equation. As an example, the approximation equation can be given as below. In addition, A and B are coefficients, and f is the sum of the current-state output wavelength and the amount of wavelength change in connection with fine tuning. A and B may have different values for each channel.

$$\text{Ratio } I_{m2}/I_{m1} = (1-B)2/\{1+B2-2\cos(Af)\} \quad (2)$$

Figure 7:
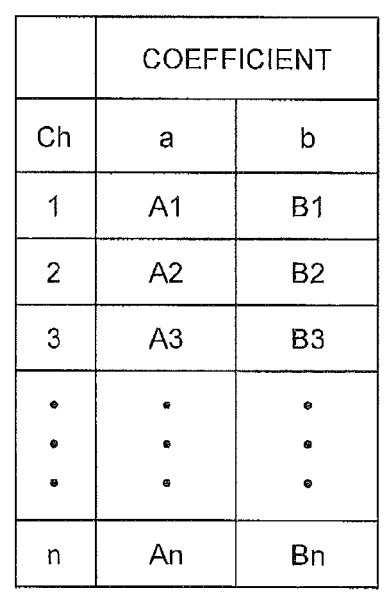

FIG. 7 is a diagram illustrating a table when coefficients A and B are determined for each channel. The table of FIG. 7 is stored in the memory 60. The controller 70, during fine tuning, reads coefficients A and B of a channel, which corresponds to a fundamental wavelength, from the table stored in the memory 60 into its own RAM. Then, the controller 70 calculates the ratio $I_{m2}/I_{m1}$ of feedback control target values.

Figure 8:
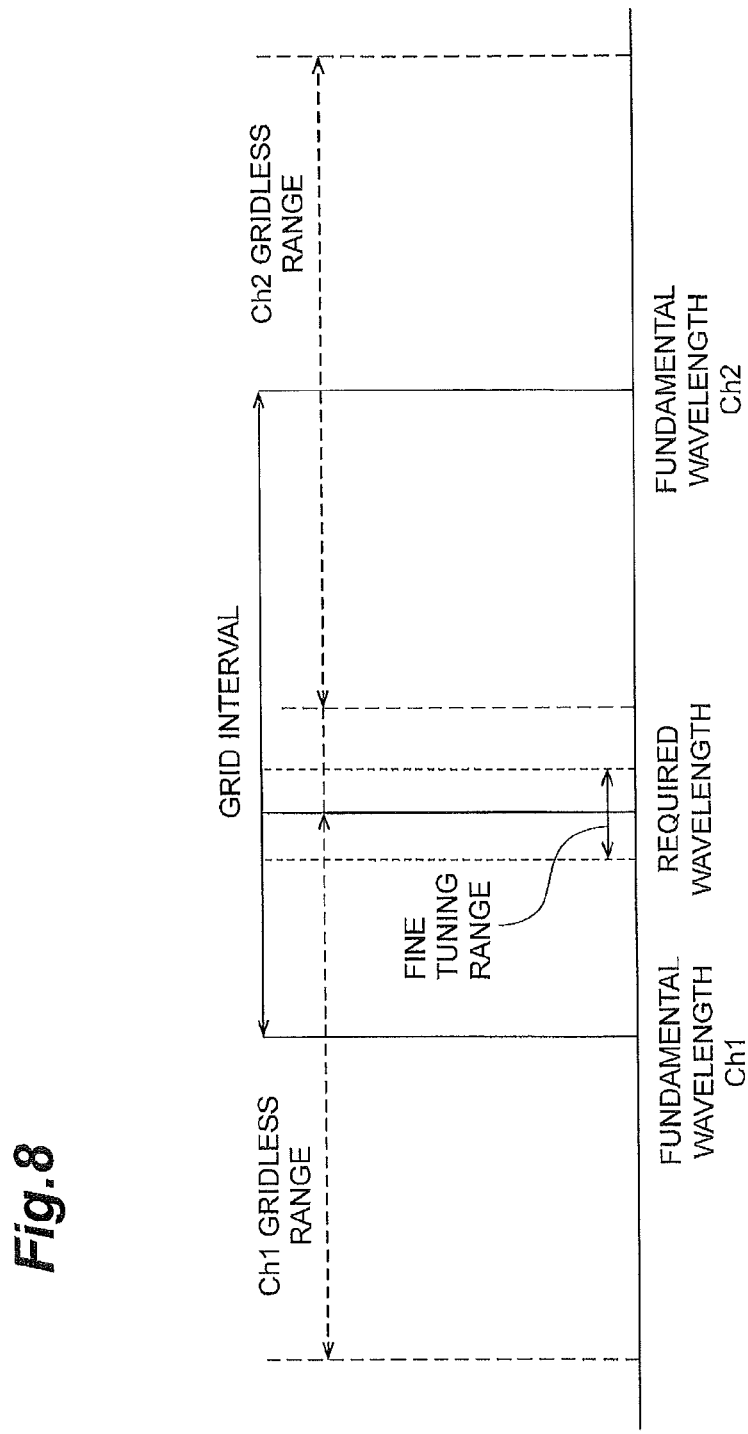
FIG. 8 is a diagram illustrating a fine tuning range.

A fine tuning range will be summarized. FIG. 8 is a diagram illustrating a fine tuning range. As illustrated in FIG. 8, it is assumed, for example, that a gridless range concerning fundamental wavelength Ch1 is Ch1 gridless range. Furthermore, it is assumed that a gridless range concerning fundamental wavelength Ch2 is Ch2 gridless range. The boundary between Ch1 gridless range and Ch2 gridless range is a wavelength in the middle of fundamental wavelength Ch1 and fundamental wavelength Ch2. When conducting fine tuning for implementing a required wavelength, an approximation equation of Ch1 is used in Ch1 gridless range, and an approximation equation of Ch2 is used in Ch2 gridless range.

Figure 9:
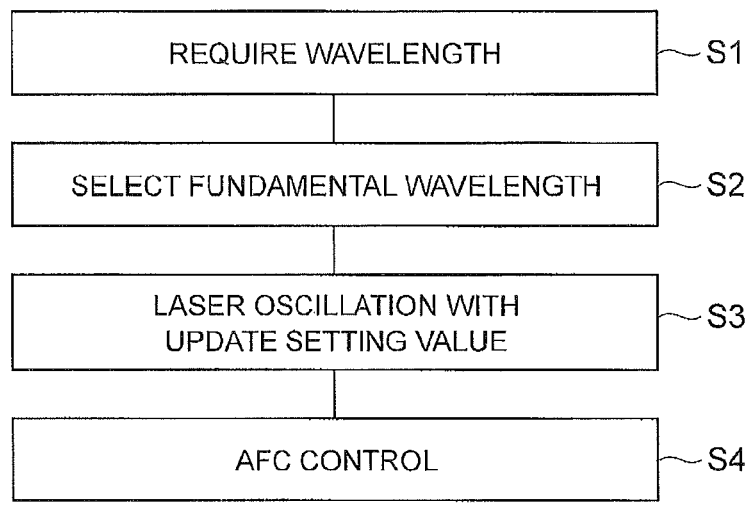
FIG. 9 is an exemplary flowchart briefly illustrating gridless control.

FIG. 9 is an exemplary flowchart briefly illustrating the gridless control. First, the controller 70 acquires information indicating the required wavelength from the outside (step S1). The controller 70 selects a fundamental wavelength, which is closest to the required wavelength, from the memory 60 based on the information indicating the required wavelength (step S2). Subsequently, the controller 70 calculates an update setting value based on the wavelength difference ΔF between the required wavelength and the fundamental wavelength. The controller 70 then causes the semiconductor laser 30 to conduct laser oscillation using the update setting value (step S3). According to the present embodiment, the update setting value is used so that, in connection with the feedback control target value and the initial setting value of the selected fundamental wavelength, the initial temperature value $T_{LD}$ of the semiconductor laser 30 is rewritten into the above-mentioned calculated temperature value $T_{LD}$. In addition, according to the present embodiment, the update setting value is used so that the initial temperature value $T_{Etalon}$ of the etalon 52 is rewritten into the above-mentioned calculated setting temperature $T_{etln\_}A$.

Next, the controller 70 conducts AFC (Automatic Frequency Control) control using the feedback control target value included in the update setting value (step S4). The AFC control is automatic wavelength control. The AFC control uses the first temperature control device 31 and controls the temperature of the semiconductor laser 30 so that $I_{m2}/I_{m1}$ of the feedback control target value is implemented. As a result of the above processing, the required wavelength is implemented. Fine tuning is performed when conducting additional fine adjustment of the oscillation wavelength.

Figure 10:
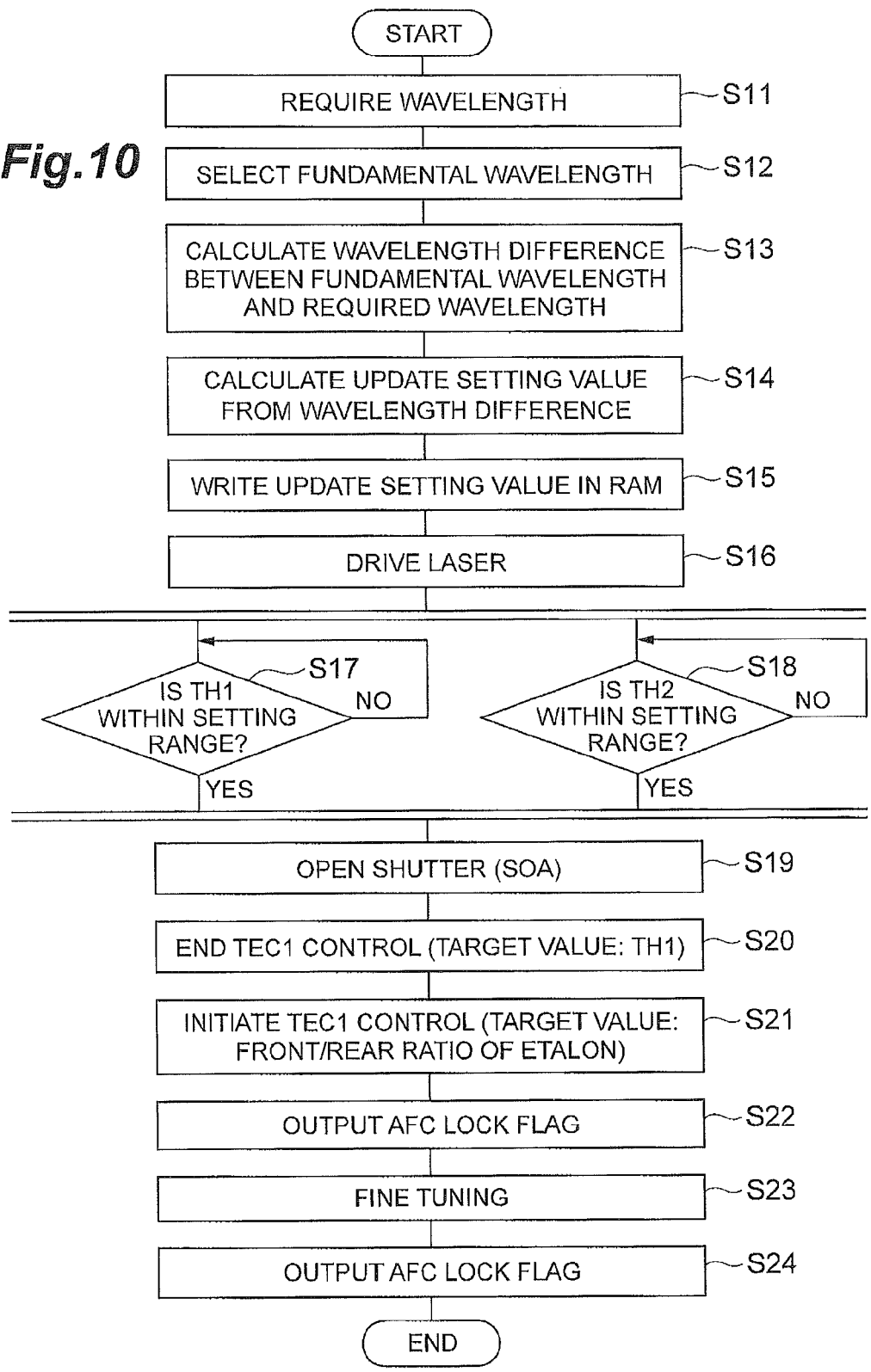
FIG. 10 is an exemplary flowchart when conducting fine tuning.

FIG. 10 is an exemplary flowchart when conducting fine tuning. As illustrated in FIG. 10, the controller 70 receives a wavelength request (step S11). The required wavelength is inputted from an external input/output device (not illustrated). Typically, an external input/output device conforming to RS232C standards is employed. Next, the controller 70 selects a fundamental wavelength, which is closest to the required wavelength, for example (step S12).

Next, the controller 70 calculates the wavelength difference $\Delta E$ between the fundamental wavelength and the required wavelength (step S13). Next, the controller 70 calculates an update setting value (step S14). Next, the controller 70 writes the update setting value in its own RAM (step S15). Next, the controller 70 drives the semiconductor laser 30 using the update setting value written in the RAM (step S16). In addition, control is conducted so that, in the SOA area C, light is not outputted from the semiconductor laser 30 at this time.

Next, the controller 70 determines whether the detection temperature $T_{H1}$ of the first thermistor 32 is within the range of $T_{LD}$ or not (step S17). The range of $T_{LD}$, in this case, is a range having the temperature value $T_{LD}$ of the update setting value at its center. When "No" is determined in step S17, the controller 70 changes the current value, which is supplied to the first temperature control device 31, so that the detection temperature $T_{H1}$ of the first thermistor 32 approaches the temperature value $T_{LD}$.

In parallel with step S17, the controller 70 determines whether the detection temperature T of the second thermistor 55 is within the setting range or not (step S18). The setting range in this case is determined based on the setting temperature $T_{etln\_}A$ included in the update setting value. For example, the setting range can be a range having the setting temperature $T_{etln\_}A$ at its center. When "No" is determined in step S18, the controller 70 changes the current value, which is supplied to the second temperature control device 53, so that the detection temperature $T_{H2}$ of the second thermistor 55 approaches the setting temperature $T_{etln\_}A$.

The controller 70 stands by until "Yes" is determined in both steps S17 and S18. When "Yes" is determined in both steps S17 and S18, the controller 70 opens the shutter (step S19). Specifically, the current supplied to the electrode 21 of the SOA area C is controlled to the initial current value $I_{SOA}$. As a result, laser light of the update wavelength 30 based on the update setting value is outputted from the semiconductor laser.

Next, the controller 70 ends the temperature control by the first temperature control device 31, which uses the temperature value $T_{LD}$ as the control target, (step S20). Next, the controller 70 initiates AFC control by the first temperature control device 31 (step S21). That is, the controller 70 conducts feedback control so that the temperature of the first temperature control device 31 satisfies the ratio $I_{m2}/I_{m1}$ of the feedback control target values. The ratio of input light and output light of the etalon 52 (front/rear ratio) indicates the oscillation wavelength of the semiconductor laser 30. The first temperature control device 31 is a parameter that controls the wavelength of the semiconductor laser 30. In step S21, the temperature of the first temperature control device 31 is subjected to feedback control so that the front/rear ratio becomes $I_{m2}/I_{m1}$. As a result of this control, the wavelength of the semiconductor laser 30 is controlled. Therefore, the required wavelength is implemented.

The controller 70 confirms that the ratio $I_{m2}/I_{m1}$ is within a range that has, at its center, the target value $I_{m2}/I_{m1}$ regarding the fundamental wavelength selected in step S2. Thereafter, the controller 70 outputs an AFC lock flag (step S22). Subsequently, the controller 70 initiates fine tuning for conducting fine adjustment of the output wavelength (step S23). In connection with fine tuning, the amount of wavelength shift for fine tuning is designated. Designation of the amount of shift is typically inputted after a lock flag is outputted in step S22. It is also possible to input the designation concurrently with the initial designation of the required wavelength in step S11. In connection with fine tuning, coefficients A and B of a channel corresponding to a fundamental wavelength selected in step S12 are read from the memory 60 into its own RAM. Next, a new target value is calculated by calculating the designated amount of shift and the ratio $I_{m2}/I_{m1}$ using the above-mentioned approximation equation. Next, the temperature of the first temperature control device 31 is controlled so that the ratio $I_{m2}/I_{m1}$ is implemented. The oscillation wavelength of the semiconductor laser 30 is changed by the temperature control of the first temperature control device 31 and, when this is confirmed to be the new target value or fall within a range having a predetermined width with respect to that value, the controller 70 outputs the AFC lock flag again (step S24). Thereafter, execution of the flowchart is ended.

The tunable wavelength laser 100 according to the present embodiment does not change the temperature of the etalon 52 during fine tuning, but changes the light transmission ratio target of AFC control. In this case, there is no need to change the temperature of the etalon 52 even when the light transmission ratio of the etalon 52 has a high degree of temperature dependency. Therefore, high-precision temperature control is unnecessary. Furthermore, by means of the tunable wavelength laser 100 according to the present embodiment, the amount of variation of the ratio $I_{m2}/I_{m1}$ of feedback control target values increases with respect to a minute amount of wavelength variation. Therefore, in the case of the tunable wavelength laser 100, fine adjustment becomes easier compared with a case of changing the temperature of the etalon 52.

(First Variant)

Figure 11:
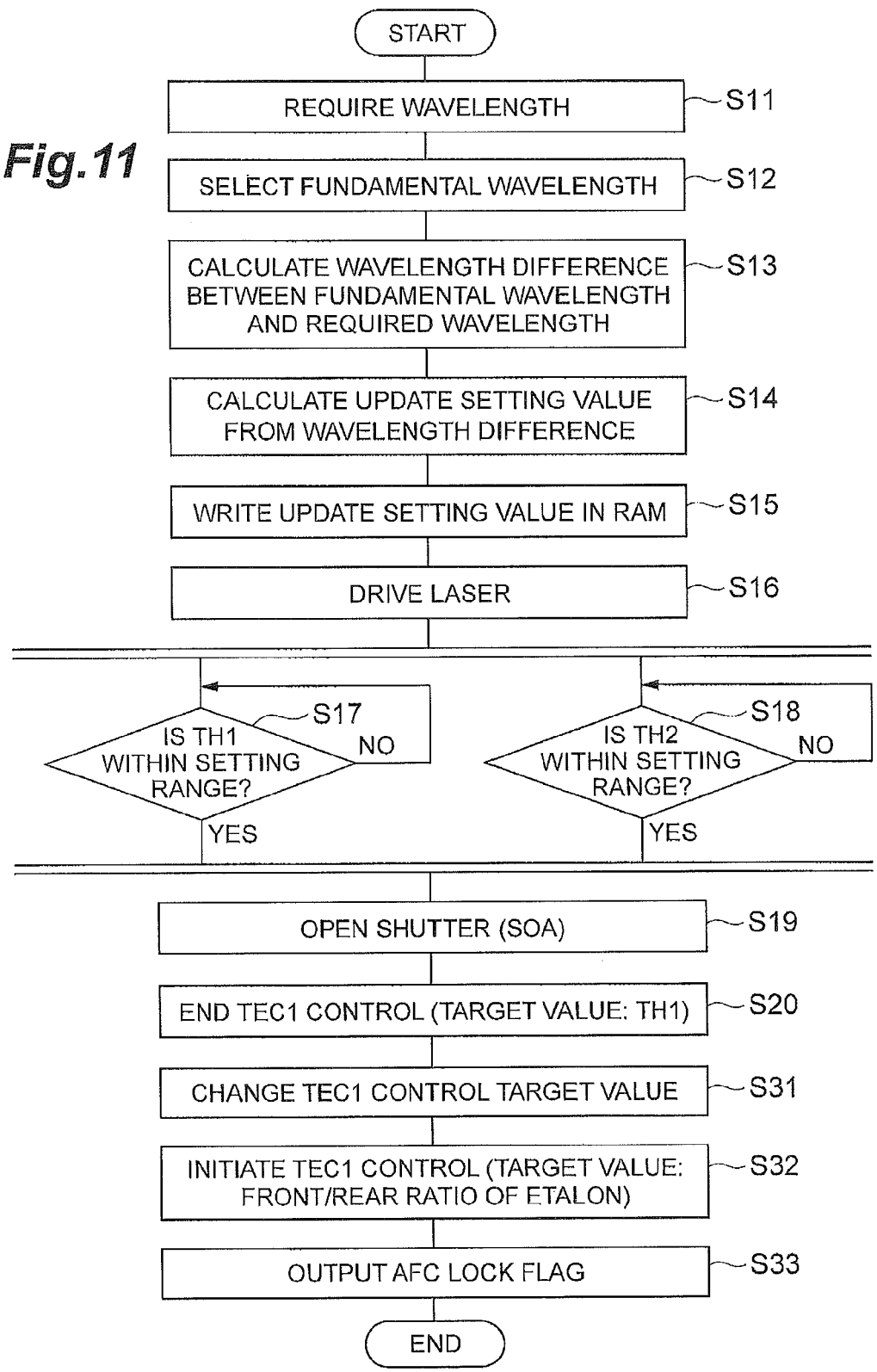
FIG. 11 is an exemplary flowchart when the required wavelength is replaced at the peak of fine tuning.

FIG. 11 is an exemplary flowchart when the required wavelength is replaced during fine tuning. Differences from FIG. 10 will be described. After execution of step S20, the controller 70 reads coefficients A and B of a channel corresponding to a fundamental wavelength selected in step S12 from the memory 60 into its own RAM. Next, the controller 70 calculates the ratio $I_{m2}/I_{m1}$ using the above-mentioned approximation equation (step S31). Thereafter, the controller 70 initiates AFC control by means of the first temperature control device 31 using the calculated ratio $I_{m2}/I_{m1}$ (step S32). After confirming that the obtained wavelength falls within a desired range, the controller 70 outputs a lock flag (step S33). Thereafter, execution of the flowchart is ended. In the case of the first variant, AFC control is conducted after a change of the feedback control target value. Therefore, it is possible to continue the fine tuning.

(Second Variant)

On the other hand, a case is conceivable in which, following implementation of an output at a desired wavelength after fine tuning, the shutter is closed, and another output is made at the same wavelength. In this case, when opening the shutter, the same wavelength can be easily outputted by executing steps S19-S33 of FIG. 11.

Although a solid etalon is employed as the etalon 52 in the above-described embodiments, it is also possible to employ a different etalon. For example, a liquid-crystal etalon having a liquid-crystal layer interposed between mirrors may be used as the etalon 52. In this case, wavelength characteristics of the liquid-crystal etalon can be shifted by controlling the voltage applied to liquid crystals. It is also possible to use an air gap etalon capable of changing the gap length between mirrors in response to the applied voltage as the etalon 52. In this case, wavelength characteristics of the air gap etalon can be shifted by controlling the applied voltage. In the case of either the liquid-crystal etalon or the air gap etalon, temperature control is conducted by the second temperature control device 53. However, the temperature control in this case is not for the purpose of shifting wavelength characteristics, but for the purpose of preventing any variation of wavelength characteristics resulting from temperature factors. Therefore, the temperature is controlled constantly.

In addition, in the above-described embodiments, the fundamental wavelength can be referred to as a first wavelength. In addition, the required wavelength can be referred to as a second wavelength. Furthermore, the ratio $I_{m2}/I_{m1}$ of feedback control target values included in the update setting values can be referred to as a first target value. The ratio $I_{m2}/I_{m1}$ for fine adjustment of wavelengths obtained from the relationship between the wavelength and transmission ratio of the etalon 52 can be referred to as a second target value.

Although embodiments of the present invention have been described in detail above, the present invention is not limited to any specific embodiment related thereto, but various changes and modifications can be made within the scope of the gist of the present invention as described in the accompanying claims.

What is claimed is:

1. A method of controlling a wavelength tunable laser system having a wavelength detector including an etalon comprising:
   acquiring a first control value corresponding to a first wavelength including a first target value and a first value to control the wavelength characteristics of the etalon based on information designating an oscillation wavelength;
   acquiring information of a second wavelength different from the first wavelength;
   calculating a second value to control the wavelength characteristics of the etalon based on a difference between the first wavelength and the second wavelength;
   controlling a wavelength of the wavelength tunable laser system by controlling the wavelength characteristics of the etalon based on the second value, and a result of detection of the wavelength detector and the first target value;
   acquiring a wavelength shift value of the information designating an oscillation wavelength;
   calculating a second target value when the wavelength of the tunable wavelength laser has shifted as much as a proportion corresponding to the wavelength shift value; and
   controlling the wavelength of the wavelength tunable laser system based on a result of detection of the wavelength detector and the second target value.

2. The method according to claim 1, wherein the control value of wavelength characteristics of the etalon is temperature of the etalon.

3. The method according to claim 1 wherein the second target value is obtained by the wavelength shift value, a correction coefficient, and wavelength obtained by controlling the wavelength characteristics.

4. The method according to claim 1, wherein temperature of the tunable wavelength laser is controlled by a temperature control device, and the controlling the wavelength is performed by means of temperature control by the temperature control device.

* * * * *